United States Patent
Utsunomiya et al.

(10) Patent No.: US 6,207,996 B1
(45) Date of Patent: Mar. 27, 2001

(54) SEMICONDUCTOR DEVICE AND METHOD FOR MANUFACTURING THE SAME

(75) Inventors: Fumiyasu Utsunomiya; Yoshifumi Yoshida, both of Chiba (JP)

(73) Assignee: Seiko Instuments Inc. (JP)

( * ) Notice: Subject to any disclaimer, the term of this patent is extended or adjusted under 35 U.S.C. 154(b) by 0 days.

(21) Appl. No.: 09/450,159

(22) Filed: Nov. 29, 1999

(30) Foreign Application Priority Data

Nov. 30, 1998 (JP) .................................................. 10-340272

(51) Int. Cl.[7] .......................... H01L 27/01; H01L 27/12; H01L 31/0392

(52) U.S. Cl. .......................... 257/356; 257/347; 257/360; 257/361

(58) Field of Search ..................................... 257/347, 355, 257/356, 360, 361, 362

(56) References Cited

U.S. PATENT DOCUMENTS 5,939,753 * 8/1999 Ma et al. .............................. 257/339
6,124,615 * 9/2000 Lee ...................................... 257/349

* cited by examiner

Primary Examiner—Ngân V. Ngô
(74) Attorney, Agent, or Firm—Adams & Wilks

(57) ABSTRACT

A semiconductor device is provided without degrading the performance of an internal circuit, which has an SOI structure coexistingly having an SOI static electricity protection circuit to prevent an internal circuit from being damaged due to static electricity through an input/output pad. To achieve this, a structure is made by comprising a silicon substrate of a first conductivity type, a buried oxide film formed on the silicon substrate, a first silicon layer of the first conductivity type formed on the buried oxide film, a second silicon layer of the first conductivity type formed on the buried oxide film and having a thickness smaller than the first silicon layer of the first conductivity type, and an SOI static electricity protection circuit provided between an input/output pad and an internal circuit. The internal circuit is formed in the second silicon layer of the first conductivity type, the SOI static electricity protection circuit being formed in the first silicon layer of the first conductivity type.

1 Claim, 4 Drawing Sheets

SEMICONDUCTOR DEVICE AND METHOD FOR MANUFACTURING THE SAME

BACKGROUND OF THE INVENTION

This invention relates to a semiconductor integrated circuit device having an SOI (Silicon on Insulator) structure. More particularly, the invention is concerned with an SOI static electricity protection circuit for preventing an internal circuit from being damaged due to static electricity or the like to be inputted through the input/output pad, and the internal circuit.

In general, a static electricity protection circuit is provided between an input/output pad and an internal circuit to instantaneously release high voltage, such as static electricity, having been inputted through the input/output pad into regions other than the internal circuit (silicon substrate or the like). Due to this, the internal circuit (particularly, a MOSFET gate oxide film) is prevented from being damaged due to a high voltage as this.

The static electricity protection circuits as above involve avalanche breakdown at PN junctions, snap back owing to MOSFET bipolar operation, punch through by punch-through devices, and so on. The static electricity protection circuits of these types have a performance that the possibility of applying a high voltage to an internal circuit can be decreased with decrease in resistance over a high-voltage releasing path. Furthermore, prevention is also made against thermal breakdown to be caused due to flow of an overcurrent by the static electricity protection circuit itself. That is, static electricity protection performance is enhanced. The resistance is almost determined principally by an area of a PN junction of the static electricity protection circuit through which a high voltage current is to flow and a volume of a substrate.

For static electricity protection circuits made in a bulk structure, the PN junction has an area corresponding to an area of a side surface plus that of a bottom surface thereof, accordingly being sufficient in junction area. Also, the volume is sufficient because the substrate itself corresponds to a bulk.

Meanwhile, the SOI structure includes a buried oxide film on a silicon substrate, and a silicon layer of a first conductivity type in which semiconductor elements are to be built on the buried oxide film.

Recently, in order to realize high speed operation with low power consumption for an internal circuit formed in a silicon layer, there are necessities to completely deplete a MOSFET forming an internal circuit and reduce source and drain capacitance. Due to this, there is a tendency of decreasing the thickness of a silicon layer. In a case that a static electricity protection circuit made in a bulk structure for a semiconductor device is applied directly to a semiconductor device having an SOI structure as stated before, the reduction in silicon layer thickness is meant to decrease the volume of a substrate due to a reduction in thickness of the first conductivity type silicon layer as a substrate besides the decrease in PN junction area due to reduction in PN junction side surface area and losing a bottom surface area.

That is, recently there has been a difficulty in applying a static electricity protection circuit made in a bulk structure for a semiconductor device directly to an SOI-structured semiconductor device, because of the reason as discussed above.

SUMMARY OF THE INVENTION

It is, therefore, an object of the present invention to provide, in a semiconductor device having an SOI structure, an SOI static electricity protection circuit which is capable of properly protecting an internal circuit against a high voltage, such as static electricity, to be inputted through an input/output pad without lowering the performance of the internal circuit.

A semiconductor device having an SOI structure according to the present invention comprises: a silicon substrate of a first conductivity type; a buried oxide film formed on the silicon substrate; a first silicon layer of a first conductivity type formed on the buried oxide film; a second silicon layer of the first conductivity type formed on the buried oxide film and having a thickness smaller than the first silicon layer; an SOI static electricity protection circuit provided between an input/output pad and an internal circuit; wherein the internal circuit is formed in the second silicon layer of the first conductivity type, and the SOI static electricity protection circuit is formed in the first silicon layer of the first conductivity type.

As stated before, the formation of an SOI static electricity protection circuit in the thick first first-conductivity-type silicon layer can increase the area of a PN junction for the SOI static electricity protection circuit as well as the volume of the SOI static electricity protection circuit in the substrate, improving protection performance for the SOI static electricity protection circuit. Furthermore, an internal circuit can be configured in the thin second first-conductivity-type silicon layer. Accordingly, the internal circuit is not degraded in performance.

Furthermore, the invention uses a method for manufacturing a semiconductor device comprising: a step of forming a buried oxide film in a silicon substrate of a first conductivity type; a step of selectively oxidizing a surface of the first-conductivity-type silicon layer on the buried oxide film and selectively forming an oxide film on the surface of the first-conductivity-type silicon layer; a step of stripping away the oxide film and thereby exposing a surface of a second first-conductivity-type silicon layer smaller in thickness than the first-conductivity-type silicon layer under the oxide film; and a step of forming an internal circuit in the second first-conductivity-type silicon layer and forming an SOI static electricity protection circuit for protecting the internal circuit against static electricity from an insert/output pad in the first first-conductivity-type silicon layer other than the second first-conductivity-type silicon layer.

The use of this method makes it possible to form on a same substrate a first first-conductivity-type silicon layer and a second first-conductivity-type silicon layer that are different in thickness. The formation of an SOI static electricity protection circuit in the thick first first-conductivity-type silicon layer can increase the area of a PN junction for the SOI static electricity protection circuit. Moreover, the SOI static electricity protection circuit at a substrate region can be increased in volume, improving protection performance for the SOI static electricity protection circuit. Furthermore, an internal circuit can be configured in the thin second first-conductivity-type silicon layer. Thus, the internal circuit is not degraded in performance. Furthermore, the second first-conductivity-type silicon layer has a surface provided flat and less in defects as compared to that formed by a method of machining or directly etching the first-conductivity-type silicon layer. Accordingly, Al interconnections for the internal circuit to be formed on the surface are prevented from suffering defects such as disconnection. Also, the boundary between the thick silicon layer and the thin silicon layer can be made in a lightly tapered form. This can prevent trouble of disconnection in an interconnection between the circuits, including the SOI static electricity protection circuit, formed in the thick silicon layer and the circuits, including the internal circuit, formed in the thin silicon layer.

Furthermore, the invention uses a method for manufacturing a semiconductor device comprising: a step of dividing a silicon substrate of a first conductivity type with a first silicon layer of the first conductivity type and a second silicon layer of the first conductivity type, forming a first buried oxide film underneath a surface of the first silicon layer of the first conductivity type, and forming a second buried oxide film in a region deeper than the first buried oxide film underneath a surface of the second silicon layer of the first conductivity type; and a step of forming an internal circuit in the second first-conductivity-type silicon layer and forming an SOI static electricity protection circuit for protecting the internal circuit against static electricity in the first-conductivity-type silicon layer other than the second first-conductivity-type silicon layer.

The use of this method makes it possible to form on a same substrate a first first-conductivity-type silicon layer and a second first-conductivity-type silicon layer that are different in thickness. The formation of an SOI static electricity protection circuit in the thick first first-conductivity-type silicon layer can increase the area of a PN junction for the SOI static electricity protection circuit. Moreover, the SOI static electricity protection circuit at a substrate region can be increased in volume, improving protection performance for the SOI static electricity protection circuit. Furthermore, an internal circuit can be configured in the thin second first-conductivity-type silicon layer. Thus, the internal circuit is not degraded in performance. Furthermore, it is possible to decrease the number of process steps correspondingly to unnecessary processes such as the oxide film forming process and the oxide film stripping process, as compared to the aforementioned method of stripping away a selectively-formed oxide film to form a first first-conductivity-type silicon layer and a second first-conductivity-type silicon layer that are different in thickness. Also, no boundary exists between the first first-conductivity-type silicon layer and the second first-conductivity-type silicon layer, thus providing flatness. This can prevent trouble of disconnection in an interconnection between the circuits, including the SOI static electricity protection circuit, formed in the first first-conductivity-type silicon layer and the circuits, including the internal circuit, formed in the second first-conductivity-type silicon layer.

DETAILED DESCRIPTION OF THE PREFERRED EMBODIMENT

A semiconductor device using an SOI structure according to the present invention and method for manufacturing the same will now be described with reference to the drawings. It should be noted that the drawings are simplified for the explanation sake and hence not intended for the invention to be limited thereto.

Figure 1:
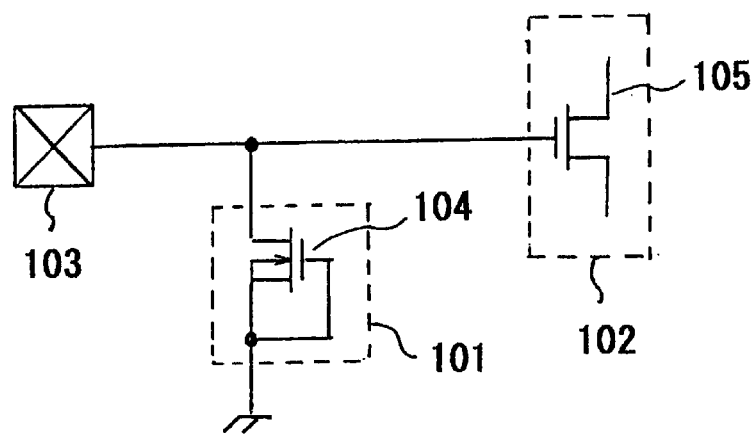
FIG. 1 is a schematic circuit diagram of a semiconductor device having an SOI structure according to the present invention.

Referring to FIG. 1, there is illustrated a schematic circuit diagram of a semiconductor device using an SOI structure according to an embodiment of the invention. As shown in FIG. 1, the semiconductor device is configured by an input/output pad 103 for inputting or outputting a signal, an internal circuit 102 formed by a MOSFET 105 or the like, and an SOI static electricity protection circuit 101 formed by an N-channel MOSFET 104. The N-channel MOSFET 104 has its drain connected to a node connecting between the input/output pad 103 and the internal circuit 102. The source and gate electrodes of the N-channel MOSFET 104 are connected to a GND terminal.

In the above configuration, it is possible to prevent an gate oxide film on the MOSFET 105 or the like of the internal circuit 102 from being applied by a high voltage due to snap back that is caused by escaping static electricity inputted to the input/output pad 103 onto the GND terminal by bipolar operation following surface breakdown in the N-channel MOSFET 104. In this manner, the gate oxide film is prevented from being damaged.

Figure 2:
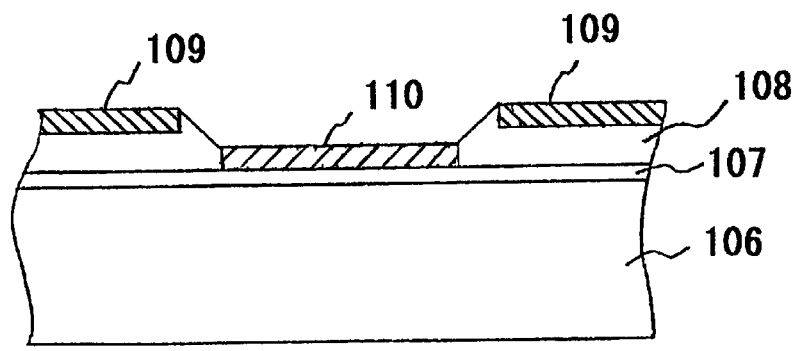
FIG. 2 is a typical sectional view of the semiconductor device having an SOI structure according to the present invention.

Referring to FIG. 2, there is illustrated a typical sectional view of the semiconductor device using an Sol structure according to the embodiment of the invention. As shown in FIG. 2, the semiconductor device is in an SOI structure formed by a buried oxide film 107 provided on a silicon substrate 106 of a first conductivity type, and a silicon layer 108 of the first conductivity type having thick and thin regions coexisting on the buried oxide film 107. An SOI static electricity protection circuit is formed in an region A 109 as a surface of the thick region of the first-conductivity-type silicon layer 108, while an internal circuit 102 is formed in a region B 110 as a surface of the thin region of the first-conductivity-type silicon layer 108.

Figure 3:
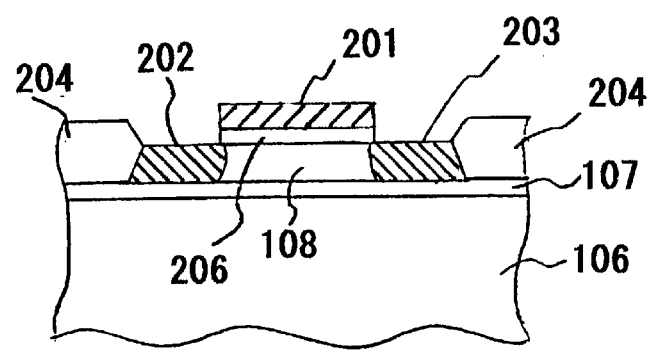
FIG. 3 is a schematic sectional view of an internal circuit formed in a thin silicon layer.

Referring to FIG. 3, a typical sectional view of a MOSFET 105 is shown which is a part of the internal circuit 102 formed in the region B 110 of FIG. 2. As shown in FIG. 3, a buried oxide film 107 is formed on a silicon substrate 106 of a first conductivity type. In a first-conductivity-type silicon layer 108 on the buried oxide film 107, formed are a MOSFET drain 202, source 203, gate 201, gate oxide film 206 and LOCOS oxide films 204. Incidentally, a MOSFET channel region as a substrate region becomes the first-conductivity-type silicon layer 108 left after the MOSFET formation.

As shown in FIG. 3, because the MOSFET borders at its drain 202 and source 203 on the LOCOS oxidation films 204 and buried oxide film 107, it has PN junctions that are at junctions with the first-conductivity-type silicon layer 108. Accordingly, in the MOSFET the drain 202 and the source 203 can be reduced in PN junction capacitance. It is therefore possible to reduce the amount and time of charge and discharge current to and from the drain 202 and source 203. That is, a MOSFET can be realized which is rapid in on-off response speed but low in current consumption upon switching. Furthermore, because the first-conductivity-type silicon layer 108 as a channel region is formed small in thickness as shown in FIG. 3, complete depletion is possible in the channel region. Consequently, the gate electrode 201 is reduced in charge/discharge current thereby reducing charge/discharge time. Thus, a MOSFET is realized which is high in on-off response speed but low in current consumption upon switching.

Accordingly, by configuring an internal circuit using the MOSFET of FIG. 3, the internal circuit will be low in current consumption but high in operation speed and can be operated at a desired speed even with power voltage to the internal circuit reduced.

Figure 4:
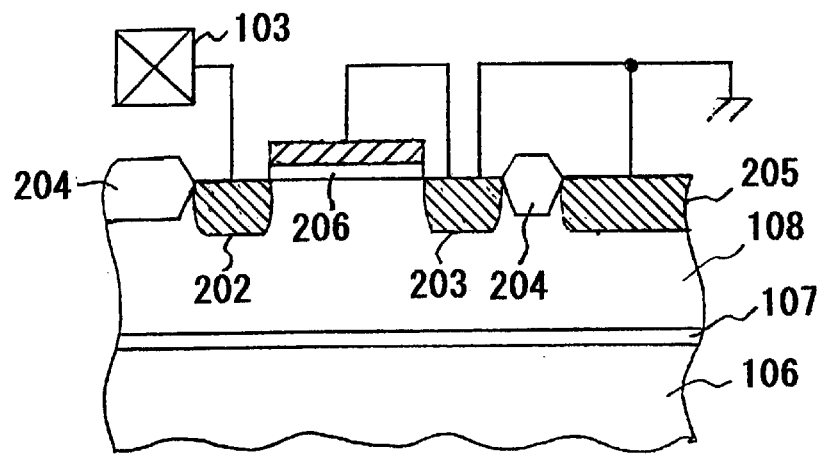
FIG. 4 is a schematic sectional view of a static electricity protection circuit formed in a thick silicon layer.

Referring FIG. 4, there is shown a typical sectional view of a semiconductor device having an N-channel MOSFET 104 formed as an SOI static electricity protection circuit 101 in the region A 110 of FIG. 2. Explanations will be omitted for the same elements as those of FIG. 3. As shown in FIG. 4, a substrate contact layer 205 which is higher in impurity concentration than a first-conductivity-type silicon layer 108 is added to a MOSFET configured same as that of FIG. 3 in order to connect the first-conductivity-type silicon layer 108 region to a GND terminal. Incidentally, a drain 202 is connected to an input/output pad 103 while a gate electrode is connected to the GND terminal through a source 203.

As shown in FIG. 4 a buried oxide film 107 is positioned deeper than the buried oxide film of FIG. 3. This provides the following structural features. First, the drain 202 and source 203 are not prevented by the buried oxide film 107 from being diffused in a depth direction and allowed to be formed deeper than those of FIG. 3. This increases PN junction areas of the drains 202 and source 203 at their side surfaces as compared to the structure of FIG. 3. Moreover, the drain 202 and source 203 can have PN junctions at their bottom surfaces, correspondingly increasing the PN junction areas. Second, a first-conductivity-type silicon layer provided as a substrate portion for the MOSFET is increased in volume more than that of FIG. 3.

Incidentally, where using an internal circuit configured by a MOSFET of FIG. 3 and an SOI static electricity protection circuit of FIG. 4, it is possible to form an SOI static electricity protection circuit during a process of forming an internal circuit without requiring new additional process thus providing also a feature.

The operation of static electricity protection by the SOI static electricity protection circuit constructed as above will be described with reference to FIG. 4. The static electricity charges entered through the input/output pad 103 first flow from the drain 202 to the first-conductivity-type silicon layer 108 due to surface breakdown. The surface breakdown produces electron-and-hole pairs whose holes flow to the substrate contact layer 205 through the first-conductivity-type silicon layer 108. On this occasion, the first-conductivity-type silicon layer 108 has a resistance component. Accordingly, the current flow through the resistance component causes a potential difference so that potential is increased in a deeper region of the silicon layer than the channel region. As a result, a bipolar turns on which is constituted by the N-type drain 202, the deeper silicon layer than the p-type channel region and the N-type source 203, thus allowing the charges to flow. This operation releases the static electricity charges entering through the input/output pad 103. Thus, the internal circuit connected to the input/output pad 103 can be prevented from being damaged due to static electricity.

It can be considered that the higher the capability of releasing static electricity the higher the performance of the SOI static electricity protection circuit. The capability of releasing static electricity is increased with decrease in resistance value of a resistance component of each portion when the bipolar is turned on. That is, the capability of releasing static electricity increases with increase in the junction area between the drain 202 as a static electricity charge path and the first-conductivity-type silicon layer 108 as well as the volume of the first-conductivity-type silicon layer 108 at a deeper region than the channel region having a role to flow static electricity charge from the drain 202 to the source 203 and the SOI static electricity protection circuit having preferred performance can be obtained.

From the above point of view, where an SOI static electricity protection circuit as discussed above is formed in a thin first-conductivity-type silicon layer 108 as shown in FIG. 3, even if a bipolar turns on as mentioned above, there is considerable decrease in the junction area between a drain 202 as a static electricity charge path and a first-conductivity-type silicon layer 108 as well as in the volume of a first-conductivity-type silicon layer 108 at a deeper region than a channel region having a role to flow static electricity charges from a drain 202 to a source 203. This cannot release static electricity charges at all. Besides, the reduced volume of the first-conductivity-type silicon layer 108 makes it difficult to diffuse the heat caused due to charge flow, possibly resulting in thermal breakdown in the SOI static electricity protection circuit.

In order to avoid this, in the present invention the SOI static electricity protection circuit was formed in the thick first-conductivity-type silicon layer 108 as shown in FIG. 4. This makes it possible to obtain an SOI structure having a close performance to that of a conventional static electricity protection circuit formed in a first-conductivity-type bulk substrate. Furthermore, by forming a MOSFET constituting an internal circuit in a thin first-conductivity-type silicon layer 108 as shown in FIG. 3, it is possible to obtain an excellent performance unique to the MOSFET constituted in an SOI-structured substrate as above.

That is, the present invention can provide on an SOI substrate both an internal circuit excellent in performance and an SOI static electricity protection circuit improved in static electricity protection performance. It is therefore possible to provide a semiconductor device having an SOI static electricity protection circuit which can protect properly an internal circuit from high voltage due to the static electricity inputted through the input/output pad without degrading the internal circuit performance.

Incidentally, the above embodiment was explained on the type utilizing snap back due to the bipolar operation of a MOSFET having a feature of providing a desired static electricity protection performance with a small area in the SOI static electricity protection circuit. However, for other static electricity protection circuit utilized in the conventional first-conductivity-type bulk substrate, it is possible to realize on an SOI-structured substrate an SOI static electricity protection circuit having a close performance to that. For example, for the static electricity protection circuits utilizing PN junction avalanche breakdown, punch-though device punch through or the like, the present invention can realize an SOI static electricity protection circuit having a high static electricity protection performance on an SOI-structured substrate because of obtaining a sufficient PN junction area and substrate volume as so far discussed. Also, although in the above embodiment of the invention explanation was made on the SOI static electricity protection circuit using the N-channel MOSFET, it is also possible to realize one using a P-channel MOSFET if inverting the polarity.

Now a method for manufacturing a semiconductor device having an SOI structure of the invention will be described with reference to the drawings.

Referring to FIG. 5, there is shown a view illustrating a process for manufacturing a semiconductor device having an SOI structure as was discussed in the embodiment of the invention from a usual SOI-structured substrate. Explaining according to FIGS. 5A to 5E, as shown in FIG. 5A a patterned silicon nitride (SiNx) film 301 is formed on an SOI-structured substrate formed by a first-conductivity-type silicon substrate 106, a buried oxide film 107 thereon and a first-conductivity-type silicon layer 108 thereon. Then, as shown in FIG. 5B the first-conductivity-type silicon layer 108 is oxidized at a surface not covered by the silicon nitride film 301 to form an oxide layer 302. Then, as shown in FIG. 5C the silicon nitride film 301 is stripped off, and the oxide layer is also stripped off as shown in FIG. 5D. As shown in FIG. 5E an internal circuit as stated before is formed in a region B 110 as a surface of a silicon layer region reduced in thickness by stripping off the oxide layer, while an SOI static electricity protection circuit as mentioned before is formed in a region A 109 as a silicon layer surface remained thick.

Figure 5A:
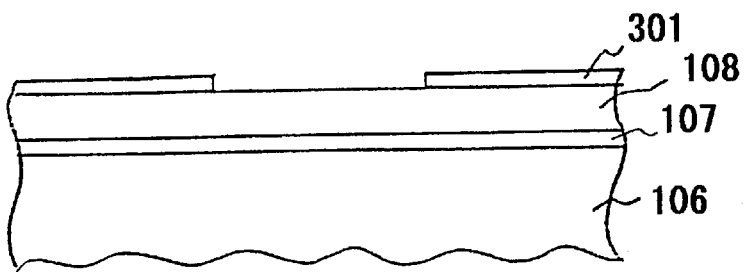
FIGS. 5A to 5E are typical sectional views for explaining a method for forming a semiconductor device having an SOI structure according to the present invention.
Figure 5B:
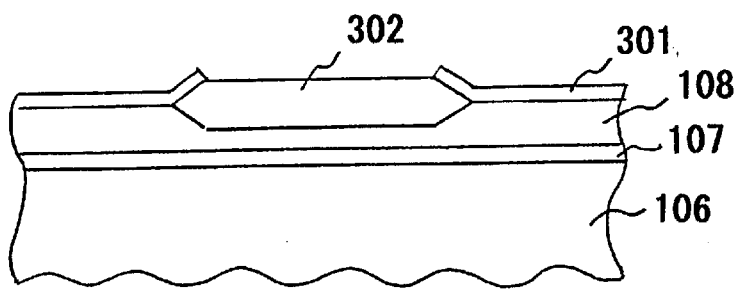
Figure 5C:
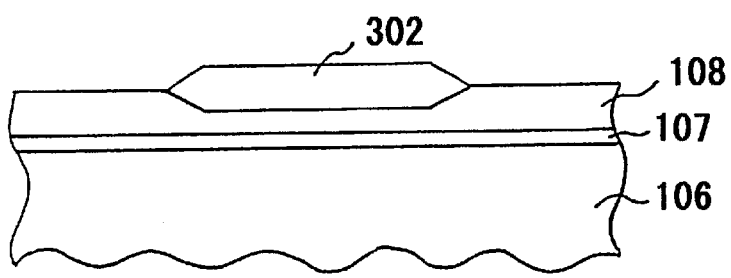

The features of this process lies in that a semiconductor device having an SOI structure as discussed in the embodiment of the invention can be easily realized by merely purchasing an SOI substrate with a silicon layer 108 made somewhat thick and that the thin silicon layer stripped of the oxide layer 302 shown in FIG. 5C is more flat and smooth with less defects as compared to the case of etching the silicon layer as it is or forming a thin silicon layer by machining. That is, the internal circuit made in the thin silicon layer will be almost free of troubles such as disconnection.

Figure 5D:
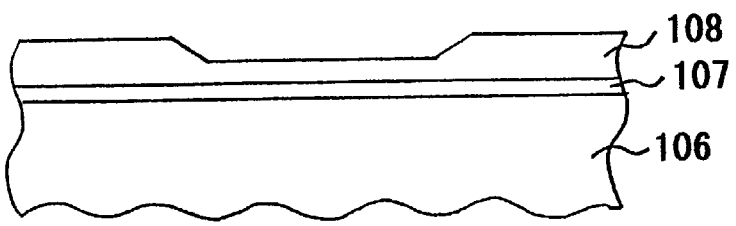
Figure 5E:
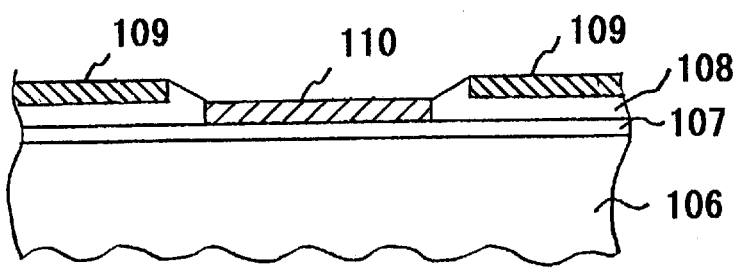

Furthermore, the thick silicon layer and the thin silicon layer has such a boundary as a lightly tapered boundary as shown in FIG. 5D. Accordingly, there is less possibility that disconnection occurs in an interconnection between the circuits, including the SOI static electricity protection circuit, formed in the region A 109 shown in FIG. 5E and the circuits, including the internal circuit, formed in the region B 110 also shown in FIG. 5E.

Referring to FIG. 6, there is shown a view illustrating a process for manufacturing a semiconductor device having an SOI structure as discussed in the embodiment of the invention from a conventional silicon substrate of a first conductivity type not having an SOI structure. As shown in FIG. 6A, oxygen molecules are ion-implanted with a weak energy into a second first-conductivity-type silicon layer as a certain determined region at a region a little lower than a surface of the silicon layer. Furthermore, as shown in FIG. 6B oxygen molecules are ion-implanted with an intense energy to a first first-conductivity-type silicon layer as the other than the second first-conductivity-type silicon layer at a region considerably lower than the surface thereof. As shown in FIG. 6C anneal is made for the oxygen molecules ion-implanted in or before the process of FIG. 6B. Thus, recrystallization is made to form a first buried oxide film 403 in a region considerably lower than the surface of the first first-conductivity-type silicon layer, and a second buried oxide film 402 in a region a little lower than the surface of the second first-conductivity-type silicon layer. As shown in FIG. 6D, an internal circuit as stated before is formed in a region B 110 in and nearby the surface of the second first-conductivity-type silicon layer while an SOI static electricity protection circuit as stated before is formed in a region A 109 in and nearby the surface of the first first-conductivity-type silicon layer.

Figure 6A:
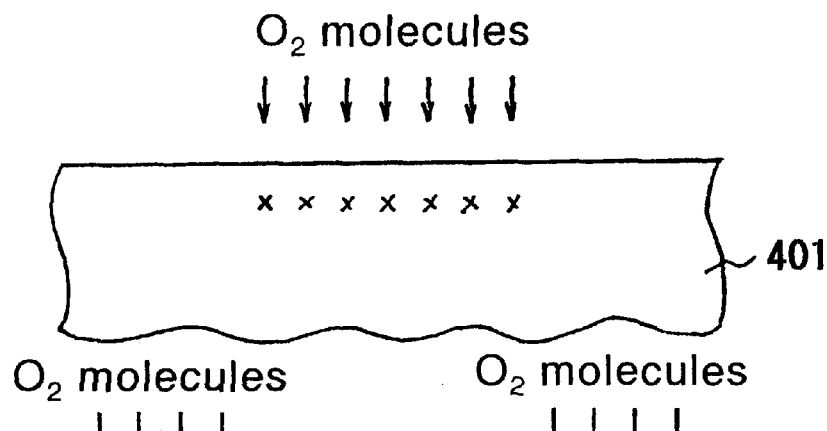
FIGS. 6A to 6D are typical sectional views for explaining a method for forming a semiconductor device having an SOI structure showing an embodiment of the present invention.
Figure 6B:
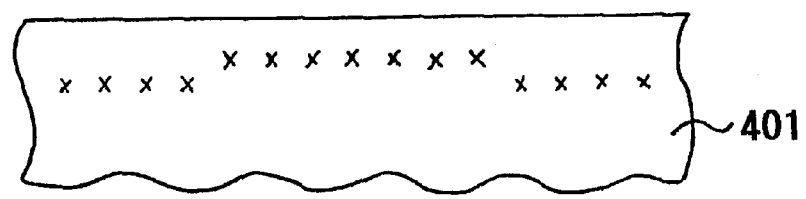
Figure 6C:
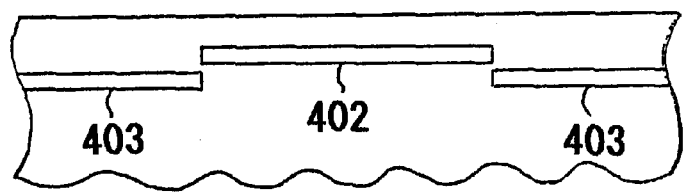
Figure 6D:
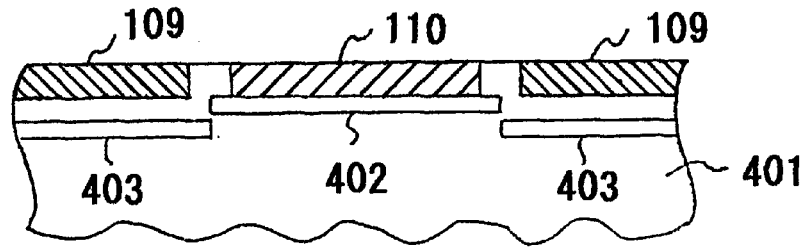

The features of this process lies in that a semiconductor device having an SOI structure as discussed in the embodiment of the invention can be easily realized merely by purchasing a conventionally-used first-conductivity-type silicon substrate and that, because buried oxide film can be formed at deep and shallow regions by merely changing the energy for oxygen molecule ion implant, thick and thin regions between the surface of the silicon substrate and the buried oxide film of the silicon layer can be formed easier and through less process steps than the process shown in FIGS. 5. Also, the silicon layer surface in FIG. 6C is considerably reduced in defects by anneal. Accordingly, there is less possibility that troubles, such as disconnection, occur in internal circuit and SOI static electricity protection circuits formed in the silicon surface. Furthermore, as shown in FIG. 6D flatness is given, instead of a boundary, between the first first-conductivity-type silicon layer and the second first-conductivity-type silicon layer. Accordingly, there is no possibility at all that disconnection occurs in an interconnection provided between the circuits, including the SOI static electricity protection circuit, formed in the region A 109 shown in FIG. 6D and the circuits, including the internal circuit, formed in the region B 110 shown in FIG. 5E.

According to the present invention, it is possible in a semiconductor device having an SOI structure to provide an SOI static electricity protection circuit for preventing an internal circuit from being damaged by static electricity entered through an input/output pad with the performances of the internal circuit maintained unchanged. Furthermore, internal and SOI static electricity protection circuits can be formed by an easy process. Moreover, the internal and SOI static electricity protection circuits can reduce the probability of occurrence of troubles such as disconnection.

What is claimed is:
1. A semiconductor device comprising:
    a silicon substrate;
    a buried oxide film formed on the silicon substrate;
    a first silicon layer of a first conductivity type formed on the buried oxide film;
    a second silicon layer of the first conductivity type formed on the buried oxide film and having a thickness smaller than the first silicon layer;
    an SOI static electricity protection circuit provided between an input/output pad and an internal circuit; and
    wherein the internal circuit is formed in the second silicon layer, and the SOI static electricity protection circuit is formed in the first silicon layer.

* * * * *